United States Patent
Okuno et al.

(10) Patent No.: US 11,926,765 B2
(45) Date of Patent: Mar. 12, 2024

(54) ADHESIVE COMPOSITION FOR PEELING OFF BY IRRADIATION WITH LIGHT, LAYERED PRODUCT, AND PRODUCTION METHOD AND PEELING METHOD FOR LAYERED PRODUCT

(71) Applicant: NISSAN CHEMICAL CORPORATION, Tokyo (JP)

(72) Inventors: Takahisa Okuno, Toyama (JP); Shunsuke Moriya, Toyama (JP); Hiroshi Ogino, Toyama (JP); Ryo Karasawa, Toyama (JP); Tetsuya Shinjo, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 263 days.

(21) Appl. No.: 17/294,730

(22) PCT Filed: Nov. 18, 2019

(86) PCT No.: PCT/JP2019/045082
§ 371 (c)(1),
(2) Date: May 18, 2021

(87) PCT Pub. No.: WO2020/105586
PCT Pub. Date: May 28, 2020

(65) Prior Publication Data
US 2022/0010178 A1 Jan. 13, 2022

(30) Foreign Application Priority Data

Nov. 19, 2018 (JP) .................................. 2018-216788
May 27, 2019 (JP) .................................. 2019-098889

(51) Int. Cl.
*C09J 11/06* (2006.01)
*B32B 43/00* (2006.01)
*C09J 5/06* (2006.01)
*C09J 183/04* (2006.01)
*H01L 21/683* (2006.01)

(52) U.S. Cl.
CPC ............. *C09J 11/06* (2013.01); *B32B 43/006* (2013.01); *C09J 5/06* (2013.01); *C09J 183/04* (2013.01); *H01L 21/6836* (2013.01); *C09J 2400/146* (2013.01); *C09J 2483/00* (2013.01); *H01L 2221/68386* (2013.01)

(58) Field of Classification Search
None
See application file for complete search history.

(56) References Cited

U.S. PATENT DOCUMENTS

| | | |
|---|---|---|
| 2,723,964 A | 11/1955 | Warrick |
| 5,248,716 A | 9/1993 | Lin et al. |
| 2007/0275255 A1 | 11/2007 | Ooms et al. |
| 2012/0175045 A1 | 7/2012 | Furuya et al. |
| 2013/0071658 A1 | 3/2013 | Nomura et al. |
| 2015/0087741 A1 | 3/2015 | Li |
| 2018/0187053 A1* | 7/2018 | Olson ...................... C09J 11/08 |
| 2020/0353735 A1 | 11/2020 | Ogino et al. |

FOREIGN PATENT DOCUMENTS

| | | |
|---|---|---|
| CN | 1074923 A | 8/1993 |
| JP | S61-117537 | 6/1986 |
| JP | S61-295076 | 12/1986 |
| JP | 2004-64040 | 2/2004 |
| JP | 2008-133423 | 6/2008 |
| JP | 2012-106486 | 6/2012 |
| JP | 2017-50322 A | 3/2017 |
| JP | 2018-142721 | 9/2018 |
| KR | 10-2013-0007611 | 1/2013 |
| WO | WO 2019/088103 A1 | 5/2019 |

OTHER PUBLICATIONS

Hohl, Diana Kay, and Christoph Weder. "(De) bonding on demand with optically switchable adhesives." Advanced Optical Materials 7.16 (2019): 1900230. (Year: 2019).*
Asadirad, Amir Mahmoud, et al. "Controlling a polymer adhesive using light and a molecular switch." Journal of the American Chemical Society 136.8 (2014): 3024-3027. (Year: 2014).*
Datasheet for Pigment Blue 63, 1 page. (Year: None).*
Datasheet for Pigment Blue 66, 1 page. (Year: None).*
ESR for EP App. No. 19 88 7697.1, dated Jul. 21, 2022.
International Search Report issed in International Patent Application No. PCT/JP2019/045082, dated Feb. 10, 2020, along with an English language translation.
Office Action for CN App. No. 201980076140, dated Jan. 11, 2023 (w/ translation).
Office Action for KR App. No. 10-2021-7018595, dated Sep. 13, 2023 (w/ translation).

* cited by examiner

*Primary Examiner* — Robert S Loewe
(74) *Attorney, Agent, or Firm* — Greenblum & Bernstein, P.L.C.

(57) ABSTRACT

An adhesive composition for use in debonding with light irradiation, which composition can achieve debonding through irradiation with light, characterized in that the adhesive composition contains an adhesive component (S) and a light-absorbing organic compound (X); and the light-absorbing organic compound (X) contains, in the molecule thereof, one or more aromatic rings, one or more rings each containing a heteroatom forming the ring, and one or more groups selected from among a carbonyl group and a thiocarbonyl group.

13 Claims, No Drawings

ADHESIVE COMPOSITION FOR PEELING OFF BY IRRADIATION WITH LIGHT, LAYERED PRODUCT, AND PRODUCTION METHOD AND PEELING METHOD FOR LAYERED PRODUCT

TECHNICAL FIELD

The present invention relates to an adhesive composition for use in debonding with light irradiation, to a laminate, to a method for producing the laminate (hereinafter may be referred to as a "laminate production method"), and to a laminate debonding method.

BACKGROUND ART

Conventionally, electronic elements and wires are 2-dimensionally (within a plane) integrated on a semiconductor wafer. In a trend toward further integration, demand has arisen for a semiconductor integration technique which achieves 3-dimensional integration (i.e., stacking) in addition to 2-dimensional integration. In the technique of 3-dimensional integration, a number of layers are stacked by the mediation of through silicon vias (TSVs). In integration of multiple layers, each component wafer to be stacked is thinned by polishing a surface opposite the circuit-furnished surface (i.e., a back surface), and the thus-thinned semiconductor wafers are stacked.

Before thinning, the semiconductor wafer (may also be called simply "wafer") is fixed to a support for facilitating polishing by means of a polishing machine. Since the fixation must be readily removed after polishing, the fixation is called temporary bonding. Temporary bonding must be easily removed from the support. When such temporary bonding is removed by excessive force, in some cases a thinned semiconductor wafer may be broken or deformed. In order to prevent such a phenomenon, the temporarily bonded support is detached in a gentle manner. However, from another aspect, it is not preferred that the temporarily bonded support be removed or slid by a stress applied during polishing of the back surface of the semiconductor wafer. Therefore, temporary bonding must withstand the stress during polishing and must be easily removed after polishing.

For example, one required performance includes having high stress (i.e., strong adhesion) within the plane during polishing and low stress (i.e., weak adhesion) toward the thickness direction during detaching.

There have been reported several methods for such bonding and debonding, the methods employing irradiation with laser light (see Patent Documents 1 and 2).

However, the adhesive for temporary bonding for use in the bonding/debonding process generates heat through irradiation with laser light, and wafers may conceivably be damaged by the heat.

PRIOR ART DOCUMENTS

Patent Documents

Patent Document 1: Japanese Patent Application Laid-Open (kokai) No. 2004-64040
Patent Document 2: Japanese Patent Application Laid-Open (kokai) No. 2012-106486

SUMMARY OF THE INVENTION

Problems to be Solved by the Invention

The present invention has been conceived under such circumstances. Thus, an object of the present invention is to provide an adhesive composition for use in debonding with light irradiation which composition provides a thin film suitably serving as an adhesive layer which has excellent heat resistance during joining to a support (i.e., curing), processing of the back surface of a wafer, and a part-mounting process and which can be easily debonded through irradiation with laser light during removal of the support. Another object is to provide a laminate employing the adhesive composition, and a production method and debonding method for the laminate.

Means for Solving the Problems

The present inventors have carried out extensive studies to attain the aforementioned objects, and have found that a film formed from a composition containing an adhesive component and a specific light-absorbing organic compound suitably serve as an adhesive layer which has excellent heat resistance during joining to a support (i.e., curing), processing of the back surface of a wafer, and a part-mounting process and which can be easily debonded through irradiation with laser light during removal of the support. The present invention has been accomplished on the basis of this finding.

Accordingly, the present invention provides the following:

1. An adhesive composition for use in debonding with light irradiation, which composition can achieve debonding through irradiation with light, characterized in that:
   the adhesive composition comprises an adhesive component (S) and a light-absorbing organic compound (X); and
   the light-absorbing organic compound (X) contains, in the molecule thereof, one or more aromatic rings, one or more rings each containing a heteroatom forming the ring, and one or more groups selected from among a carbonyl group and a thiocarbonyl group.

2. An adhesive composition for use in debonding with light irradiation according to 1 above, which composition can achieve debonding through irradiation with light, wherein:
   the adhesive composition comprises an adhesive component (S) and a light-absorbing organic compound (X); and
   the light-absorbing organic compound (X) contains, in the molecule thereof, one or more aromatic rings, one or more rings each containing a heteroatom forming the ring, and one or more carbonyl or thiocarbonyl groups.

3. An adhesive composition for use in debonding with light irradiation according to 1 or 2 above, wherein the light-absorbing organic compound (X) contains, in the molecule thereof, two or more aromatic rings, two or more rings each containing a heteroatom forming the ring, and two or more carbonyl or thiocarbonyl groups.

4. An adhesive composition for use in debonding with light irradiation according to 3 above, wherein the aromatic rings are condensed with the rings each containing a heteroatom forming the ring, and the carbon atoms of the carbonyl or thiocarbonyl groups form the rings each containing a heteroatom forming the ring.

5. An adhesive composition for use in debonding with light irradiation according to 1 or 2 above, wherein the light-absorbing organic compound (X) is represented by the following formula (T1-1) or (T2-1):

[F1]

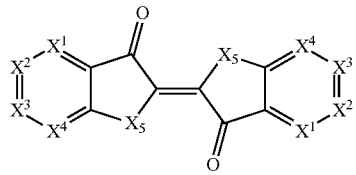
(T1-1)

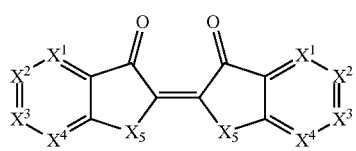
(T2-1)

(wherein each of $X^1$ to $X^4$ represents a carbon atom forming an aromatic ring, and is bonded to the adjacent carbon atoms forming the aromatic ring and to a hydrogen atom, a halogen atom, or a monovalent organic group; and $X^5$ each represents a heteroatom).

6. An adhesive composition for use in debonding with light irradiation according to 1 or 2 above, wherein the light-absorbing organic compound (X) is a thioindigo derivative or an isothioindigo derivative.

7. An adhesive composition for use in debonding with light irradiation according to 6 above, wherein the thioindigo or isothioindigo derivative is represented by the following formula (T1-2) or (T2-2):

[F2]

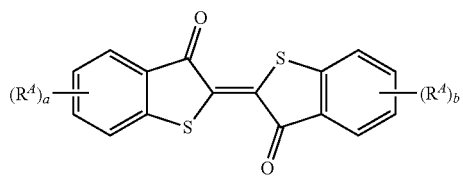
(T1-2)

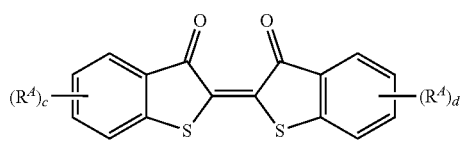
(T2-2)

(wherein $R^A$ is a substituent atom or group of a benzene ring, and represents a halogen atom, an alkyl group, an alkenyl group, an alkynyl group, or an aryl group; and each of a to d represents an integer of 0 to 4).

8. An adhesive composition for use in debonding with light irradiation according to 7 above, wherein the thioindigo or isothioindigo derivative is represented by the following formula (T1-3) or (T2-3):

[F3]

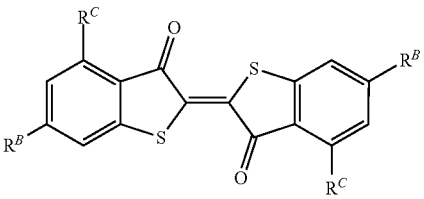
(T1-3)

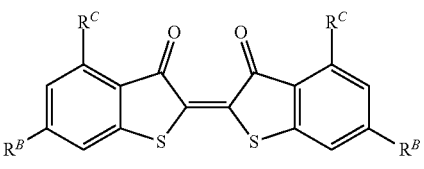
(T2-3)

(wherein each of $R^B$ and $R^C$ represents a hydrogen atom, a halogen atom, or an alkyl group).

9. An adhesive composition for use in debonding with light irradiation according to any of 1 to 8 above, wherein the adhesive component (S) contains a component (A) which is cured through hydrosilylation.

10. An adhesive composition for use in debonding with light irradiation according to any of 1 to 9 above, wherein the adhesive composition further comprises a component (B) containing at least one component selected from the group consisting of a component containing an epoxy-modified polyorganosiloxane, a component containing a methyl-group-containing polyorganosiloxane, and a component containing a phenyl-group-containing polyorganosiloxane.

11. An adhesive composition for use in debonding with light irradiation according to 9 or 10 above, wherein the component (A) which is cured through hydrosilylation comprises a polysiloxane (A1) having one or more units selected from the group consisting of a siloxane unit represented by $SiO_2$ (unit Q), a siloxane unit represented by $R^1R^2R^3SiO_{1/2}$ (unit M), a siloxane unit represented by $R^4R^5SiO_{2/2}$ (unit D), and a siloxane unit represented by $R^6SiO_{3/2}$ (unit T) (wherein each of $R^1$ to $R^6$ is a group or an atom bonded to a silicon atom and represents an alkyl group, an alkenyl group, or a hydrogen atom) and a platinum group metal catalyst (A2); and the polysiloxane (A1) comprises a polyorganosiloxane (a1) having one or more units selected from the group consisting of a siloxane unit represented by $SiO_2$ (unit Q'), a siloxane unit represented by $R^{1'}R^{2'}R^{3'}SiO_{1/2}$ (unit M'), a siloxane unit represented by $R^{4'}R^{5'}SiO_{2/2}$ (unit D'), and a siloxane unit represented by $R^{6'}SiO_{3/2}$ (unit T'), and at least one unit selected from the group consisting of unit M', unit D', and unit T' (wherein each of $R^{1'}$ to $R^{6'}$ is a group bonded to a silicon atom and represents an alkyl group or an alkenyl group, and at least one of $R^{1'}$ to $R^{6'}$ is an alkenyl group), and a polyorganosiloxane (a2) having one or more units selected from the group consisting of a siloxane unit represented by $SiO_2$ (unit Q''), a siloxane unit represented by $R^{1''}R^{2''}R^{3''}SiO_{1/2}$ (unit M''), a siloxane unit represented by $R^{4''}R^{5''}SiO_{2/2}$ (unit D''), and a siloxane unit represented by $R^{6''}SiO_{3/2}$ (unit T''), and at least one unit selected from the group consisting of unit M'', unit D'', and unit T'' (wherein each of $R^{1''}$ to $R^{6''}$ is a group or an atom bonded to a silicon atom and represents an alkyl group or a hydrogen atom, and at least one of $R^{1''}$ to $R^{6''}$ is a hydrogen atom).

12. A laminate comprising a first substrate formed of a semiconductor-forming substrate, a second substrate formed of a support substrate which allows passage of laser light, and an adhesive layer, wherein the adhesive layer is a cured film formed from an adhesive composition for use in debonding with light irradiation as recited in any of 1 to 11 above.

13. A method for producing a laminate, the method comprising a first step of applying an adhesive composition for use in debonding with light irradiation as recited in any of 1 to 11 above onto a surface of a first or second substrate, to thereby form an adhesive coating layer; and a step of adhering the first substrate to the second substrate by the mediation of the adhesive coating layer; applying a load to the first substrate and the second substrate in a thickness direction, to thereby closely bind the first substrate, the adhesive coating layer, and the second substrate, while at least one of a heat treatment and a reduced pressure treatment is performed; and then performing a post-heat treatment.

14. A debonding method comprising irradiating a laminate produced through a laminate production method as recited in 13 above with laser light from the second substrate side of the laminate, to thereby debond the second substrate.

15. A debonding method according to 14 above, wherein the laser light has a wavelength of 190 nm to 600 nm.

Effects of the Invention

The specific light-absorbing organic compound used in the present invention, in particular, a thioindigo derivative or an isothioindigo derivative, which is advantageous in that it is relatively inexpensive and exhibits high solubility in an organic solvent, has good light absorbability. Thus, mixing of such a derivative with an adhesive component can readily prepare a composition that can form a thin film suitably serving as an adhesive layer for use in debonding with light irradiation, which adhesive layer effectively bonds a support to a workpiece (e.g., a wafer) during processing of the workpiece and, after the processing, achieves debonding by a decrease in bonding strength through desirable absorption of laser light. Therefore, employment of the adhesive composition of the present invention for use in debonding with light irradiation can produce an adhesive layer that achieves debonding by irradiation with laser light without application of an excessive load for debonding to a support or a workpiece (e.g., a wafer).

The laminate of the present invention includes a first substrate formed of a semiconductor-forming substrate, a second substrate formed of a support substrate that allows passage of laser light, and an adhesive layer formed of a cured film formed from the adhesive composition for use in debonding with light irradiation having the aforementioned characteristic feature. Thus, the second substrate can be readily debonded from the adhesive layer by irradiating the adhesive layer with laser light from the second substrate side.

MODES FOR CARRYING OUT THE INVENTION

The present invention will next be described in more detail.

The adhesive composition of the present invention for use in debonding with light irradiation can be used for forming, for example, an adhesive layer that is used for binding of a support and a circuit surface of a wafer in a peelable manner and for processing of the back surface of the wafer. The adhesive composition contains an adhesive component (S) and a light-absorbing organic compound (X), wherein the light-absorbing organic compound (X) contains, in the molecule thereof, one or more aromatic rings, one or more rings each containing a heteroatom forming the ring, and one or more groups selected from among a carbonyl group and a thiocarbonyl group.

In one preferred embodiment, the light-absorbing organic compound (X) contained in the adhesive composition of the present invention for use in debonding with light irradiation contains, in the molecule thereof, one or more aromatic rings, one or more rings each containing a heteroatom forming the ring, and one or more carbonyl or thiocarbonyl groups.

The adhesive composition of the present invention for use in debonding with light irradiation forms an adhesive layer that can achieve debonding through irradiation with laser light. Since the adhesive layer contains the light-absorbing organic compound (X), the bonding strength of the adhesive layer is reduced through desirable absorption of laser light. Thus, the adhesive layer can be debonded off without application of an excessive load for debonding to, for example, a support or a wafer, which is advantageous.

By the mediation of the adhesive layer formed from the adhesive composition of the present invention for use in debonding with light irradiation, a support and a wafer are temporarily bonded. The wafer can be thinned by, for example, processing (e.g., polishing) a surface opposite the circuit surface of the wafer (i.e., a back surface).

The laminate of the present invention includes a first substrate formed of a semiconductor-forming substrate, a second substrate formed of a support substrate that allows passage of laser light, and an adhesive layer formed of a cured film formed from the aforementioned adhesive composition for use in debonding with light irradiation. Any functional layer that allows or does not allow passage of laser light may be provided between any of the substrates and the adhesive layer. In this case, the functional layer is appropriately selected so as not to inhibit debonding with laser light irradiation.

In one preferred embodiment of the present invention, the laminate of the present invention includes a first substrate formed of a semiconductor-forming substrate, a second substrate formed of a support substrate that allows passage of laser light, and an adhesive layer which is formed of a cured film formed from the aforementioned adhesive composition for use in debonding with light irradiation and which is provided between these two substrates so as to be in contact with them.

The laminate of the present invention can achieve debonding by irradiating the laminate with laser light from the second substrate side (which substrate allows passage of laser light) without application of an excessive load for debonding.

The wavelength of the laser light is generally 190 nm to 600 nm. The wavelength is preferably 250 nm or more, more preferably 300 nm or more, preferably 580 nm or less, more preferably 560 nm or less, from the viewpoint of, for example, effective debonding at high reproducibility. The laminate of the present invention can achieve effective debonding by use of laser light having a wavelength of, for example, 308 nm, 355 nm, or 532 nm.

In the present invention, the second substrate must allow passage of laser light used for debonding. However, if light irradiation can be performed from the first substrate side, the second substrate does not necessarily allow passage of laser light.

As used herein, the expression "can be debonded" or "peelable" refers to a state of lower bonding strength. In other words, it means excellent peelability for ensuring easy debonding. The bonding strength of an adhesive layer formed from the adhesive composition of the present invention for use in debonding with light irradiation is considerably reduced through irradiation with laser light, as compared with that in the stage before irradiation.

Thus, the adhesive layer formed from the adhesive composition of the present invention for use in debonding with light irradiation achieves effective bonding between, for example, a first substrate formed of a wafer and a second substrate formed of a support substrate that allows passage of laser light during processing (e.g., thinning) of the wafer. After completion of the processing, the adhesive layer is readily debonded off or removed through laser light irradiation.

The light-absorbing organic compound (X) contained in the adhesive composition of the present invention for use in debonding with light irradiation contains, in the molecule thereof, one or more aromatic rings, one or more rings each containing a heteroatom forming the ring, and one or more groups selected from among a carbonyl group and a thiocarbonyl group. Preferably, the light-absorbing organic compound (X) contains, in the molecule thereof, one or more aromatic rings, one or more rings each containing a heteroatom forming the ring, and one or more carbonyl or thiocarbonyl groups. More preferably, the light-absorbing organic compound (X) contains, in the molecule thereof, two or more aromatic rings, two or more rings each containing a heteroatom forming the ring, and two or more carbonyl or thiocarbonyl groups. In such a case, the light-absorbing organic compound (X) may contain either or both of a carbonyl group and a thiocarbonyl group.

No particular limitation is imposed on the number of carbon atoms contained in the aromatic ring, and the number is generally 6 to 30, preferably 20 or less, more preferably 10 or less. Specific examples of the aromatic ring include, but are not limited to, a benzene ring, a naphthalene ring, and an anthracene ring.

No particular limitation is imposed on the ring containing a heteroatom forming the ring, so long as it has a cyclic structure and contains a heteroatom (e.g., an oxygen atom, a sulfur atom, or a nitrogen atom) forming the ring. The ring may be an aromatic or non-aromatic ring. The ring containing a heteroatom forming the ring is generally a 4- to 10-membered ring, preferably a 4- to 6-membered ring, more preferably a 5-membered ring. The number of heteroatoms forming the ring is generally 1 to 3, preferably 1 or 2, more preferably 1. The atoms other than the heteroatom(s) forming the ring are carbon atoms.

No particular limitation is imposed on the molecular weight of the light-absorbing organic compound (X), so long as the compound exhibits good compatibility with an additional component. The molecular weight is generally 5,000 or less. The molecular weight is preferably 2,500 or less, more preferably 1,000 or less, still more preferably 700 or less, much more preferably 600 or less, from the viewpoint of, for example, securing the solubility of the compound in an organic solvent to thereby prepare a composition having excellent homogeneity at high reproducibility. The molecular weight is preferably 50 or more, more preferably 100 or more, still more preferably 200 or more, much more preferably 250 or more, from the viewpoint of, for example, preventing sublimation of the compound caused by heating or pressure reduction during attachment to thereby prevent contamination of operation environment.

The light-absorbing organic compound (X) is generally in the form of solid or liquid, preferably in the form of solid, at 25° C. and $1.013 \times 10^5$ Pa.

In one preferred embodiment of the present invention, in the light-absorbing organic compound (X), an aromatic ring is condensed with a ring containing a heteroatom forming the ring.

In one preferred embodiment of the present invention, in the light-absorbing organic compound (X), the carbon atom of a carbonyl or thiocarbonyl group forms a ring containing a heteroatom forming the ring.

In one preferred embodiment of the present invention, when the carbon atom of a carbonyl or thiocarbonyl group forms a ring containing a heteroatom forming the ring in the light-absorbing organic compound (X), the number of carbonyl or thiocarbonyl groups is generally 1 to 3, preferably 1 or 2, more preferably 1, per one ring containing a heteroatom forming the ring.

In one preferred embodiment of the present invention, the number of carbonyl or thiocarbonyl groups having a carbon atom that does not form a ring containing a heteroatom forming the ring is preferably 3 or less, more preferably 2 or less, still more preferably 1 or less, much more preferably 0.

In one preferred embodiment of the present invention, the light-absorbing organic compound (X) is represented by the following formula (T1-1) or (T2-1).

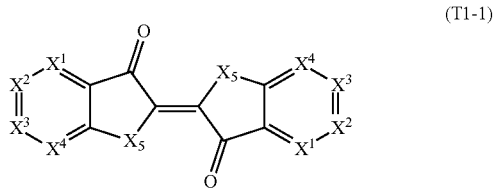

(T1-1)

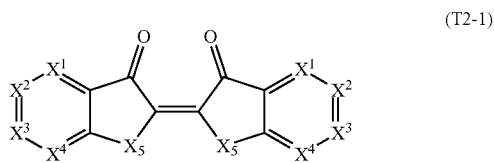

(T2-1)

Each of $X^1$ to $X^4$ represents a carbon atom forming an aromatic ring, and is bonded to the adjacent carbon atoms forming the aromatic ring and to a hydrogen atom, a halogen atom, or an organic group. $X^5$ represents a heteroatom such as an oxygen atom, a sulfur atom, or a nitrogen atom. When $X^5$ is a nitrogen atom, the nitrogen atom is bonded to the adjacent carbon atoms forming a ring and to a hydrogen atom or an organic group.

The light-absorbing organic compound (X) is preferably a thioindigo or isothioindigo derivative, more preferably a thioindigo or isothioindigo derivative represented by the following formula (T1-2) or (T2-2).

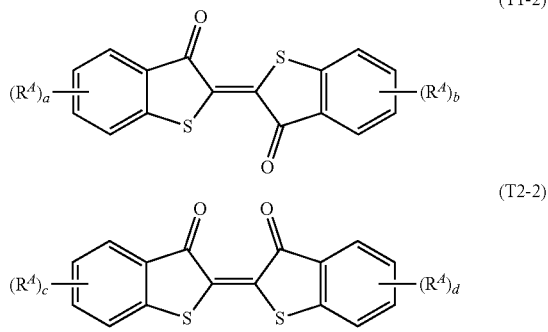

Each $R^A$ represents a substituent atom or group of a benzene ring, specifically, a halogen atom, an alkyl group, an alkenyl group, an alkynyl group, or an aryl group.

Examples of the halogen atom include a fluorine atom, a chlorine atom, a bromine atom, and an iodine atom. A chlorine atom is preferred.

The alkyl group may be linear-chain, branched-chain, or cyclic, but a linear-chain or branched-chain alkyl group is preferred. No particular limitation is imposed on the number of carbon atoms thereof, and the number of carbon atoms is generally 1 to 40, preferably 30 or less, more preferably 20 or less, still more preferably 10 or less.

Specific examples of the linear-chain or branched chain alkyl group include, but are not limited to, methyl, ethyl, n-propyl, i-propyl, n-butyl, i-butyl, s-butyl, t-butyl, n-pentyl, 1-methyl-n-butyl, 2-methyl-n-butyl, 3-methyl-n-butyl, 1,1-dimethyl-n-propyl, 1,2-dimethyl-n-propyl, 2,2-dimethyl-n-propyl, 1-ethyl-n-propyl, n-hexyl, 1-methyl-n-pentyl, 2-methyl-n-pentyl, 3-methyl-n-pentyl, 4-methyl-n-pentyl, 1,1-dimethyl-n-butyl, 1,2-dimethyl-n-butyl, 1,3-dimethyl-n-butyl, 2,2-dimethyl-n-butyl, 2,3-dimethyl-n-butyl, 3,3-dimethyl-n-butyl, 1-ethyl-n-butyl, 2-ethyl-n-butyl, 1,1,2-trimethyl-n-propyl, 1,2,2-trimethyl-n-propyl, 1-ethyl-1-methyl-n-propyl, and 1-ethyl-2-methyl-n-propyl.

Of these, methyl is preferred.

Specific examples of the cyclic alkyl group include, but are not limited to, cycloalkyl groups such as cyclopropyl, cyclobutyl, 1-methyl-cyclopropyl, 2-methyl-cyclopropyl, cyclopentyl, 1-methyl-cyclobutyl, 2-methyl-cyclobutyl, 3-methyl-cyclobutyl, 1,2-dimethyl-cyclopropyl, 2,3-dimethyl-cyclopropyl, 1-ethyl-cyclopropyl, 2-ethylcyclopropyl, cyclohexyl, 1-methyl-cyclopentyl, 2-methyl-cyclopentyl, 3-methyl-cyclopentyl, 1-ethyl-cyclobutyl, 2-ethyl-cyclobutyl, 3-ethyl-cyclobutyl, 1,2-dimethyl-cyclobutyl, 1,3-dimethyl-cyclobutyl, 2,2-dimethyl-cyclobutyl, 2,3-dimethyl-cyclobutyl, 2,4-dimethyl-cyclobutyl, 3,3-dimethyl-cyclobutyl, 1-n-propyl-cyclopropyl, 2-n-propyl-cyclopropyl, 1-i-propyl-cyclopropyl, 2-i-propyl-cyclopropyl, 1,2,2-trimethyl-cyclopropyl, 1,2,3-trimethyl-cyclopropyl, 2,2,3-trimethyl-cyclopropyl, 1-ethyl-2-methyl-cyclopropyl, 2-ethyl-1-methyl-cyclopropyl, 2-ethyl-2-methyl-cyclopropyl, and 2-ethyl-3-methyl-cyclopropyl; and bicycloalkyl groups such as bicyclobutyl, bicyclopentyl, bicyclohexyl, bicycloheptyl, bicyclooctyl, bicyclononyl, and bicyclodecyl.

The alkenyl group may be linear-chain or branched-chain. No particular limitation is imposed on the number of carbon atoms thereof, and the number of carbon atoms is generally 2 to 40, preferably 30 or less, more preferably 20 or less, still more preferably 10 or less.

Specific examples of the alkenyl group include, but are not limited to, ethenyl, 1-propenyl, 2-propenyl, 1-methyl-1-ethenyl, 1-butenyl, 2-butenyl, 3-butenyl, 2-methyl-1-propenyl, 2-methyl-2-propenyl, 1-ethylethenyl, 1-methyl-1-propenyl, 1-methyl-2-propenyl, 1-pentenyl, 2-pentenyl, 3-pentenyl, 4-pentenyl, 1-n-propylethenyl, 1-methyl-1-butenyl, 1-methyl-2-butenyl, 1-methyl-3-butenyl, 2-ethyl-2-propenyl, 2-methyl-1-butenyl, 2-methyl-2-butenyl, 2-methyl-3-butenyl, 3-methyl-1-butenyl, 3-methyl-2-butenyl, 3-methyl-3-butenyl, 1,1-dimethyl-2-propenyl, 1-i-propylethenyl, 1,2-dimethyl-1-propenyl, 1,2-dimethyl-2-propenyl, 1-cyclopentenyl, 2-cyclopentenyl, 3-cyclopentenyl, 1-hexenyl, 2-hexenyl, 3-hexenyl, 4-hexenyl, 5-hexenyl, 1-methyl-1-pentenyl, 1-methyl-2-pentenyl, 1-methyl-3-pentenyl, 1-methyl-4-pentenyl, 1-n-butylethenyl, 2-methyl-1-pentenyl, 2-methyl-2-pentenyl, 2-methyl-3-pentenyl, 2-methyl-4-pentenyl, 2-n-propyl-2-propenyl, 3-methyl-1-pentenyl, 3-methyl-2-pentenyl, 3-methyl-3-pentenyl, 3-methyl-4-pentenyl, 3-ethyl-3-butenyl, 4-methyl-1-pentenyl, 4-methyl-2-pentenyl, 4-methyl-3-pentenyl, 4-methyl-4-pentenyl, 1,1-dimethyl-2-butenyl, 1,1-dimethyl-3-butenyl, 1,2-dimethyl-1-butenyl, 1,2-dimethyl-2-butenyl, 1,2-dimethyl-3-butenyl, 1-methyl-2-ethyl-2-propenyl, 1-s-butylethenyl, 1,3-dimethyl-1-butenyl, 1,3-dimethyl-2-butenyl, 1,3-dimethyl-3-butenyl, 1-i-butylethenyl, 2,2-dimethyl-3-butenyl, 2,3-dimethyl-1-butenyl, 2,3-dimethyl-2-butenyl, 2,3-dimethyl-3-butenyl, 2-i-propyl-2-propenyl, 3,3-dimethyl-1-butenyl, 1-ethyl-1-butenyl, 1-ethyl-2-butenyl, 1-ethyl-3-butenyl, 1-n-propyl-1-propenyl, 1-n-propyl-2-propenyl, 2-ethyl-1-butenyl, 2-ethyl-2-butenyl, 2-ethyl-3-butenyl, 1,1,2-trimethyl-2-propenyl, 1-t-butylethenyl, 1-methyl-1-ethyl-2-propenyl, 1-ethyl-2-methyl-1-propenyl, 1-ethyl-2-methyl-2-propenyl, 1-i-propyl-1-propenyl, 1-i-propyl-2-propenyl, 1-methyl-2-cyclopentenyl, 1-methyl-3-cyclopentenyl, 2-methyl-1-cyclopentenyl, 2-methyl-2-cyclopentenyl, 2-methyl-3-cyclopentenyl, 2-methyl-4-cyclopentenyl, 2-methyl-5-cyclopentenyl, 2-methylene-cyclopentyl, 3-methyl-1-cyclopentenyl, 3-methyl-2-cyclopentenyl, 3-methyl-3-cyclopentenyl, 3-methyl-4-cyclopentenyl, 3-methyl-5-cyclopentenyl, 3-methylene-cyclopentyl, 1-cyclohexenyl, 2-cyclohexenyl, and 3-cyclohexenyl.

Of these, ethenyl and 2-propenyl are preferred.

The alkynyl group may be linear-chain or branched-chain. No particular limitation is imposed on the number or carbon atoms of the alkynyl group, and the number of carbon atoms is generally 2 to 40, preferably 30 or less, more preferably 20 or less, still more preferably 10 or less.

Specific examples of the alkynyl group include ethynyl, n-1-propynyl, n-2-propynyl, n-1-butynyl, n-2-butynyl, n-3-butynyl, 1-methyl-2-propynyl, n-1-pentynyl, n-2-pentynyl, n-3-pentynyl, n-4-pentynyl, 1-methyl-n-butynyl, 2-methyl-n-butynyl, 3-methyl-n-butynyl, 1,1-dimethyl-n-propynyl, n-1-hexynyl, n-1-decynyl, n-1-pentadecynyl, and n-1-eicosynyl.

The aryl group may be a phenyl group, a monovalent group prepared through removal of one hydrogen atom from a condensed-ring aromatic hydrocarbon compound, or a monovalent group prepared through removal of one hydrogen atom from a ring-linked aromatic hydrocarbon compound. No particular limitation is imposed on the number of carbon atoms of the aryl group, and the number of carbon atoms is generally 40 or less, preferably 30 or less, more preferably 20 or less, still more preferably 10 or less. The lower limit of the number is 6.

Specific examples of the aryl group include, but are not limited to, phenyl, 1-naphthyl, 2-naphthyl, 1-anthryl, 2-anthryl, 9-anthryl, 1-phenanthryl, 2-phenanthryl, 3-phenanthryl, 4-phenanthryl, 9-phenanthryl, 1-naphthacenyl, 2-naphthacenyl, 5-naphthacenyl, 2-chrysenyl, 1-pyrenyl, 2-pyrenyl, pentacenyl, benzopyrenyl, triphenylenyl, biphenyl-2-yl, biphenyl-3-yl, biphenyl-4-yl, p-terphenyl-4-yl, m-terphenyl-4-yl, o-terphenyl-4-yl, 1,1'-binaphthyl-2-yl, and 2,2'-binaphthyl-1-yl.

Of these, a halogen atom or an alkyl group is preferred as $R^A$.

Each of a to d represents an integer of 0 to 4, and is preferably 3 or less, more preferably 2 or less.

In one still more preferred embodiment of the present invention, the thioindigo or isothioindigo derivative used in the present invention is represented by the following formula (T1-3) or (T2-3).

[F6]

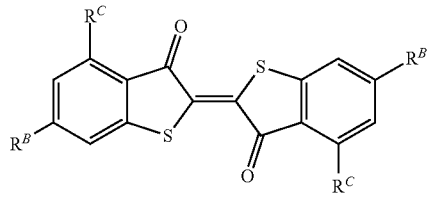

(T1-3)

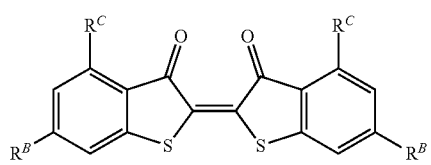

(T2-3)

Each of $R^B$ and $R^C$ represents a hydrogen atom, a halogen atom, or an alkyl group. Specific examples of the halogen atom and the alkyl group are the same as those exemplified above.

In each of the formulae (T1-3) and (T2-3), preferably, two $R^B$s are the same atom or group, and two $R^C$s are the same atom or group.

In the present invention, a thioindigo derivative is preferably used from the viewpoint of achieving the effects of the invention at higher reproducibility.

Specific examples of the thioindigo or isothioindigo derivative are shown below, but are not limited thereto.

[F7]

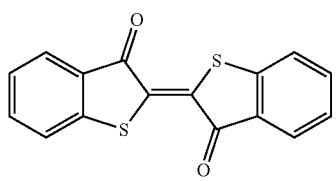

(T1-1a)

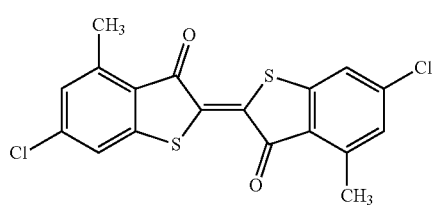

(T1-2b)

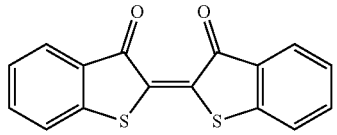

(T2-1a)

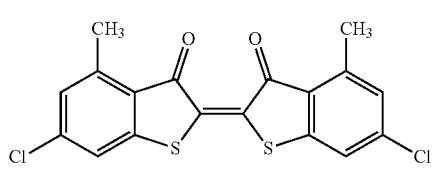

(T2-2b)

The adhesive component (S) contained in the adhesive composition of the present invention for use in debonding with light irradiation may be any compound that has adhesive property and is used as an adhesive component of similar types of compositions. Examples of such a compound include siloxane resins, hydrocarbon resins, acrylic-styrene resins, maleimide resins, and combinations of these resins. In particular, siloxane resins are preferred.

In one preferred embodiment of the present invention, the adhesive composition of the present invention for use in debonding with light irradiation contains, as the adhesive component (S), a component (A) which is cured through hydrosilylation.

In one more preferred embodiment of the present invention, the component (A) which is cured through hydrosilylation contains a polysiloxane (A1) having one or more units selected from the group consisting of a siloxane unit represented by $SiO_2$ (unit Q), a siloxane unit represented by $R^1R^2R^3SiO_{1/2}$ (unit M), a siloxane unit represented by $R^4R^5SiO_{2/2}$ (unit D), and a siloxane unit represented by $R^6SiO_{3/2}$ (unit T), and a platinum group metal catalyst (A2); wherein the polysiloxane (A1) contains a polyorganosiloxane (a1) having one or more units selected from the group consisting of a siloxane unit represented by $SiO_2$ (unit Q'), a siloxane unit represented by $R^{1'}R^{2'}R^{3'}SiO_{1/2}$ (unit M'), a siloxane unit represented by $R^{4'}R^{5'}SiO_{2/2}$ (unit D'), and a siloxane unit represented by $R^{6'}SiO_{3/2}$ (unit T'), and at least one unit selected from the group consisting of unit M', unit D', and unit T', and a polyorganosiloxane (a2) having one or more units selected from the group consisting of a siloxane unit represented by $SiO_2$ (unit Q''), a siloxane unit represented by $R^{1''}R^{2''}R^{3''}SiO_{1/2}$ (unit M''), a siloxane unit represented by $R^{4''}R^{5''}SiO_{2/2}$ (unit D''), and a siloxane unit represented by $R^{6''}SiO_{3/2}$ (unit T''), and at least one unit selected from the group consisting of unit M'', unit D'', and unit T''.

Each of $R^1$ to $R^6$ is a group or an atom bonded to a silicon atom and represents an alkyl group, an alkenyl group, or a hydrogen atom.

Each of $R^{1'}$ to $R^{6'}$ is a group bonded to a silicon atom and represents an alkyl group or an alkenyl group, and at least one of $R^{1'}$ to $R^{6'}$ is an alkenyl group.

Each of $R^{1''}$ to $R^{6''}$ is a group or an atom bonded to a silicon atom and represents an alkyl group or a hydrogen atom, and at least one of $R^{1''}$ to $R^{6''}$ is a hydrogen atom.

As described above, the polysiloxane (A1) includes the polyorganosiloxane (a1) and the polyorganosiloxane (a2). In curing, the alkenyl group present in the polyorganosiloxane (a1) and the hydrogen atom (Si—H group) present in the polyorganosiloxane (a2) form a cross-linking structure through hydrosilylation in the presence of the platinum group metal catalyst (A2).

The polyorganosiloxane (a1) has one or more units selected from the group consisting of unit Q', unit M', unit D', and unit T', and at least one unit selected from the group consisting of unit M', unit D', and unit T'. Two or more polyorganosiloxanes satisfying the above conditions may be used in combination as the polyorganosiloxane (a1).

Examples of preferred combinations of two or more units selected from the group consisting of unit Q', unit M', unit D', and unit T' include, but are not limited to, (unit Q' and unit M'), (unit D' and unit M'), (unit T' and unit M'), and (unit Q', unit T', and unit M').

In the case where the polyorganosiloxane (a1) includes two or more polyorganosiloxanes, examples of preferred combinations include, but are not limited to, (unit Q' and unit M')+(unit D' and unit M'; (unit T' and unit M')+(unit D' and unit M'); and (unit Q', unit T', and unit M')+(unit T' and unit M').

The polyorganosiloxane (a2) has one or more units selected from the group consisting of unit Q", unit M", unit D", and unit T", and at least one unit selected from the group consisting of unit M", unit D", and unit T". Two or more polyorganosiloxanes satisfying the above conditions may be used in combination as the polyorganosiloxane (a2).

Examples of preferred combinations of two or more units selected from the group consisting of unit Q", unit M", unit D", and unit T" include, but are not limited to, (unit M" and unit D"), (unit Q" and unit M"), and (unit Q", unit T", and unit M").

The polyorganosiloxane (a1) is formed of siloxane units in which an alkyl group and/or an alkenyl group is bonded to a silicon atom. The alkenyl group content of the entire substituents $R^{1'}$ to $R^{6'}$ is preferably 0.1 mol % to 50.0 mol %, more preferably 0.5 mol % to 30.0 mol %, and the remaining $R^{1'}$ to $R^{6'}$ may be alkyl groups.

The polyorganosiloxane (a2) is formed of siloxane units in which an alkyl group and/or a hydrogen atom is bonded to a silicon atom. The hydrogen atom content of the entire substituents or atoms $R^{1''}$ to $R^{6''}$ is preferably 0.1 mol % to 50.0 mol %, more preferably 10.0 mol % to 40.0 mol %, and the remaining $R^{1''}$ to $R^{6''}$ may be alkyl groups.

The polysiloxane (A1) includes the polyorganosiloxane (a1) and the polyorganosiloxane (a2). In one preferred embodiment of the present invention, the ratio by mole of alkenyl groups present in the polyorganosiloxane (a1) to hydrogen atoms forming Si—H bonds present in the polyorganosiloxane (a2) is 1.0:0.5 to 1.0:0.66.

The weight average molecular weight of each of the polyorganosiloxane (a1) and the polyorganosiloxane (a2) are generally 500 to 1,000,000, preferably 5,000 to 50,000.

In the present invention, weight average molecular weight may be determined by means of, for example, a GPC apparatus (EcoSEC, HLC-8320GPC, products of Tosoh Corporation) and GPC columns (Shodex (registered trademark), KF-803L, KF-802, and KF-801, products of Showa Denko K.K.) at a column temperature of 40° C. and a flow rate of 1.0 mL/min by use of tetrahydrofuran as an eluent (extraction solvent) and polystyrene (product of Sigma-Aldrich) as a standard substance.

The polyorganosiloxane (a1) and the polyorganosiloxane (a2) included in the adhesive composition of the present invention for use in debonding with light irradiation react with each other via hydrosilylation, to thereby form a cured film. Thus, the curing mechanism differs from the mechanism of curing mediated by, for example, silanol groups. Therefore, neither of the siloxanes of the present invention is required to have a silanol group or a functional group forming a silanol group through hydrolysis (e.g., an alkyloxy group).

In one preferred embodiment of the present invention, the component (A) contains the aforementioned polysiloxane (A1) and the platinum group metal catalyst (A2).

The platinum-based metallic catalyst is used to accelerate hydrosilylation between alkenyl groups of the polyorganosiloxane (a1) and Si—H groups of the polyorganosiloxane (a2).

Specific examples of the platinum-based metallic catalyst include, but are not limited to, platinum catalysts such as platinum black, platinum(II) chloride, chloroplatinic acid, a reaction product of chloroplatinic acid and a monohydric alcohol, a chloroplatinic acid-olefin complex, and platinum bis(acetoacetate).

Examples of the platinum-olefin complex include, but are not limited to, a complex of platinum with divinyltetramethyldisiloxane.

The amount of platinum group metal catalyst (A2) is generally 1.0 to 50.0 ppm, with respect to the total amount of polyorganosiloxane (a1) and polyorganosiloxane (a2).

The component (A) may contain a polymerization inhibitor (A3). Through incorporation of a polymerization inhibitor into the adhesive composition of the present invention for use in debonding with light irradiation, curing by heat during bonding can be suitably controlled. As a result, a composition that can provide an adhesive layer having an excellent bonding/debonding property can be produced at high reproducibility.

No particular limitation is imposed on the polymerization inhibitor, so long as it can suppress the progress of hydrosilylation. Specific examples of the polymerization inhibitor include, but are not limited to, alkynylalkyl alcohols such as 1-ethynyl-1-cyclohexanol.

Generally, the amount of polymerization inhibitor with respect to the polyorganosiloxane (a1) and the polyorganosiloxane (a2) is 1000.0 ppm or more from the viewpoint of attaining the effect, and 10,000.0 ppm or less from the viewpoint of preventing excessive suppression of hydrosilylation.

The adhesive composition of the present invention for use in debonding with light irradiation may contain a component (B) containing at least one species selected from the group consisting of a component containing an epoxy-modified polyorganosiloxane, a component containing a methyl-group-containing polyorganosiloxane, and a component containing a phenyl-group-containing polyorganosiloxane. Through incorporation of such a component (B) into the adhesive composition of the present invention for use in debonding with light irradiation, the formed adhesive layer can be suitably peeled off at high reproducibility.

Among such components (B), a component containing a methyl-group-containing polyorganosiloxane is preferred.

Examples of the epoxy-modified polyorganosiloxane include a siloxane containing a siloxane unit represented by $R^{11}R^{12}SiO_{2/2}$ (unit $D^{10}$).

$R^{11}$ is a group bonded to a silicon atom and represents an alkyl group, and $R^{12}$ is a group bonded to a silicon atom and represents an epoxy group or an organic group containing an epoxy group. Specific examples of the alkyl group include those as exemplified above.

Also, the epoxy group in the organic group containing an epoxy group may be an independent epoxy group which does not condense with another ring structure, or may be an epoxy group forming a condensed ring with another ring structure (e.g., a 1,2-epoxycyclohexyl group).

Specific example of the organic group containing an epoxy group include, but are not limited to, 3-glycidoxypropyl and 2-(3,4-epoxycyclohexyl)ethyl.

In the present invention, examples of preferred epoxy-modified polyorganosiloxanes include, but are not limited to, epoxy-modified polydimethylsiloxane.

The epoxy-modified polyorganosiloxane contains the aforementioned siloxane unit (unit $D^{10}$), but may also contain the aforementioned unit Q, unit M and/or unit T, in addition to unit $D^{10}$.

In one preferred embodiment of the present invention, specific examples of the epoxy-modified polyorganosiloxane include polyorganosiloxane formed only of unit $D^{10}$, polyorganosiloxane formed of unit $D^{10}$ and unit Q, polyorganosiloxane formed of unit $D^{10}$ and unit M, polyorganosiloxane formed of unit $D^{10}$ and unit T, polyorganosiloxane formed of unit $D^{10}$, unit Q, and unit M, polyorganosiloxane formed of unit $D^{10}$, unit M, and unit T, and polyorganosiloxane formed of unit $D^{10}$, unit Q, unit M, and unit T.

The epoxy-modified polyorganosiloxane is preferably an epoxy-modified polydimethylsiloxane having an epoxy value of 0.1 to 5. The weight average molecular weight thereof is generally 1,500 to 500,000, but preferably 100,000 or lower, for the purpose of suppression of deposition in the adhesive.

Specific examples of the epoxy-modified polyorganosiloxane include, but are not limited to, CMS-227 (product of Gelest Inc., weight average molecular weight: 27,000) represented by formula (A-1), ECMS-327 (product of Gelest Inc., weight average molecular weight: 28,800) represented by formula (A-2), KF-101 (product of Shin-Etsu Chemical Co., Ltd., weight average molecular weight: 31,800) represented by formula (A-3), KF-1001 (product of Shin-Etsu Chemical Co., Ltd., weight average molecular weight: 55,600) represented by formula (A-4), KF-1005 (product of Shin-Etsu Chemical Co., Ltd., weight average molecular weight: 11,500) represented by formula (A-5), X-22-343 (product of Shin-Etsu Chemical Co., Ltd., weight average molecular weight: 2,400) represented by formula (A-6), BY16-839 (product of Dow Corning, weight average molecular weight: 51,700) represented by formula (A-7), and ECMS-327 (product of Gelest Inc., weight average molecular weight: 28,800) represented by formula (A-8).

[F8]

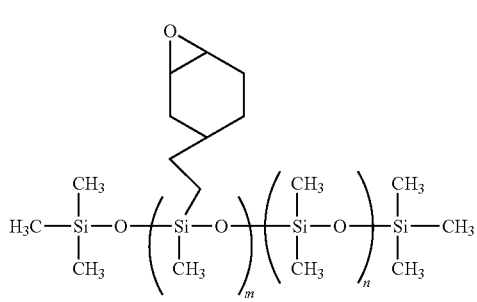

(A-1)

(Each of m and n represents the number of repeating units.)

[F9]

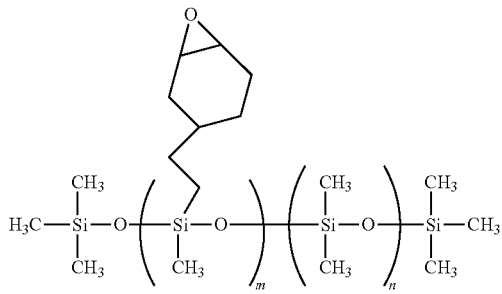

(A-2)

(Each of m and n represents the number of repeating units.)

[F10]

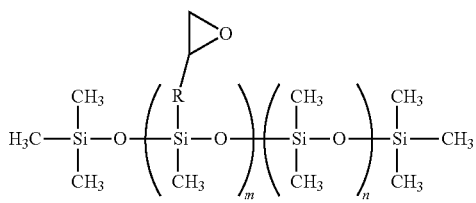

(A-3)

(Each of m and n represents the number of repeating units. R represents a C1 to C10 alkylene group.)

[F11]

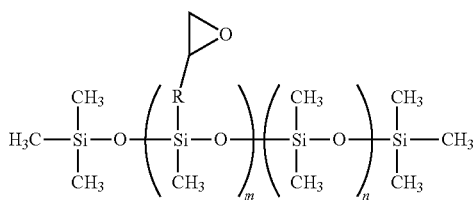

(A-4)

(Each of m and n represents the number of repeating units. R represents a C1 to C10 alkylene group.)

[F12]

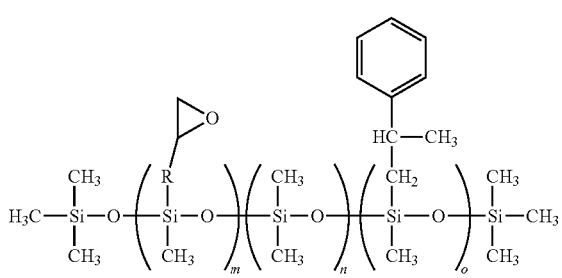

(A-5)

(Each of m, n and o represents the number of repeating units. R represents a C1 to C10 alkylene group.)

[F13]

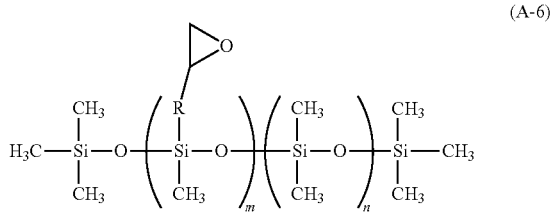

(A-6)

(Each of m and n represents the number of repeating units. R represents a C1 to C10 alkylene group.)

[F14]

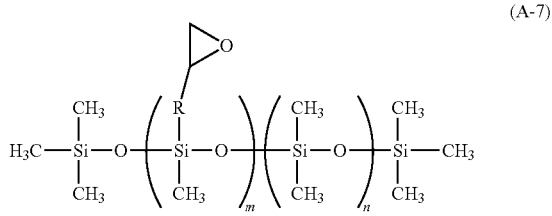

(A-7)

(Each of m and n represents the number of repeating units. R represents a C1 to C10 alkylene group.)

[F15]

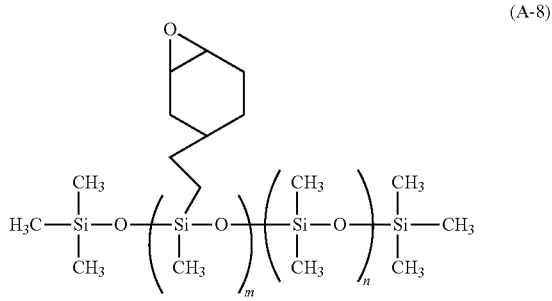

(A-8)

(Each of m and n represents the number of repeating units.)

Examples of the methyl-group-containing polyorganosiloxane include a siloxane containing a siloxane unit represented by $R^{210}R^{220}SiO_{2/2}$ (unit $D^{200}$). Preferably, the methyl-group-containing polyorganosiloxane contains a siloxane unit represented by $R^{21}R^{21}SiO_{2/2}$ (unit $D^{20}$).

Each of $R^{210}$ and $R^{220}$ is a group bonded to a silicon atom and represents an alkyl group. At least one of $R^{210}$ and $R^{220}$ is a methyl group. Specific examples of the alkyl group include those as exemplified above.

$R^{21}$ is a group bonded to a silicon atom and represents an alkyl group. Specific examples of the alkyl group include those as exemplified above. $R^{21}$ is preferably a methyl group.

In the present invention, examples of preferred methyl-group-containing polyorganosiloxanes include, but are not limited to, polydimethylsiloxane.

The methyl-group-containing polyorganosiloxane contains the aforementioned siloxane unit (unit $D^{200}$ or unit $D^{20}$), but may also contain the aforementioned unit Q, unit M and/or unit T, in addition to unit $D^{200}$ or unit $D^{20}$.

In one embodiment of the present invention, specific examples of the methyl-group-containing polyorganosiloxane include polyorganosiloxane formed only of unit $D^{200}$, polyorganosiloxane formed of unit $D^{200}$ and unit Q, polyorganosiloxane formed of unit $D^{200}$ and unit M, polyorganosiloxane formed of unit $D^{200}$ and unit T, polyorganosiloxane formed of unit $D^{200}$, unit Q, and unit M, polyorganosiloxane formed of unit $D^{200}$, unit M, and unit T, and polyorganosiloxane formed of unit $D^{200}$, unit Q, unit M, and unit T.

In one preferred embodiment of the present invention, specific examples of the methyl-group-containing polyorganosiloxane include polyorganosiloxane formed only of unit $D^{20}$, polyorganosiloxane formed of unit $D^{20}$ and unit Q, polyorganosiloxane formed of unit $D^{20}$ and unit M, polyorganosiloxane formed of unit $D^{20}$ and unit T, polyorganosiloxane formed of unit $D^{20}$, unit Q, and unit M, polyorganosiloxane formed of unit $D^{20}$, unit M, and unit T, and polyorganosiloxane formed of unit $D^{20}$, unit Q, unit M, and unit T.

The viscosity of the methyl-group-containing polyorganosiloxane is generally 1,000 to 2,000,000 mm²/s, preferably 10,000 to 1,000,000 mm²/s. The methyl-group-containing polyorganosiloxane is typically dimethylsilicone oil formed of polydimethylsiloxane. The value of the viscosity is a kinematic viscosity (cSt (=mm²/s)). The kinematic viscosity may be measured by means of a kinematic viscometer. Alternatively, the kinematic viscosity may also calculated by dividing viscosity (mPa·s) by density (g/cm³). In other words, the kinematic viscosity may be determined from a viscosity as measured at 25° C. by means of an E-type rotational viscometer and a density. The calculation formula is kinematic viscosity (mm²/s)=viscosity (mPa·s)/density (g/cm³).

Specific examples of the methyl-group-containing polyorganosiloxane include, but are not limited to, WACKER (registered trademark) SILICONE FLUID AK series (products of WACKER) and dimethylsilicone oils (KF-96L, KF-96A, KF-96, KF-96H, KF-69, KF-965, and KF-968) and cyclic dimethylsilicone oil (KF-995) (products of Shin-Etsu Chemical Co., Ltd.).

Examples of the phenyl-group-containing polyorganosiloxane include a siloxane containing a siloxane unit represented by $R^{31}R^{32}SiO_{2/2}$ (unit $D^{30}$).

$R^{31}$ is a group bonded to a silicon atom and represents a phenyl group or an alkyl group, and $R^{32}$ is a group bonded to a silicon atom and represents a phenyl group. Specific examples of the alkyl group include those as exemplified above. $R^{31}$ is preferably a methyl group.

The phenyl-group-containing polyorganosiloxane contains the aforementioned siloxane unit (unit $D^{30}$), but may also contain the aforementioned unit Q, unit M and/or unit T, in addition to unit $D^{30}$.

In one preferred embodiment of the present invention, specific examples of the phenyl-group-containing polyorganosiloxane include polyorganosiloxane formed only of unit $D^{30}$, polyorganosiloxane formed of unit $D^{30}$ and unit Q, polyorganosiloxane formed of unit $D^{30}$ and unit M, polyorganosiloxane formed of unit $D^{30}$ and unit T, polyorganosiloxane formed of unit $D^{30}$, unit Q, and unit M, polyorganosiloxane formed of unit $D^{30}$, unit M, and unit T, and polyorganosiloxane formed of unit $D^{30}$, unit Q, unit M, and unit T.

The weight average molecular weight of the phenyl-group-containing polyorganosiloxane is generally 1,500 to 500,000, but preferably 100,000 or lower, for the purpose of suppression of deposition in the adhesive and for other reasons.

Specific examples of the phenyl-group-containing polyorganosiloxane include, but are not limited to, PMM-1043 (product of Gelest Inc., weight average molecular weight: 67,000, viscosity: 30,000 mm$^2$/s) represented by formula (C-1), PMM-1025 (product of Gelest Inc., weight average molecular weight: 25,200, viscosity: 500 mm$^2$/s) represented by formula (C-2), KF50-3000CS (product of Shin-Etsu Chemical Co., Ltd., weight average molecular weight: 39,400, viscosity: 3,000 mm$^2$/s) represented by formula (C-3), TSF431 (product of MOMENTIVE, weight average molecular weight: 1,800, viscosity: 100 mm$^2$/s) represented by formula (C-4), TSF433 (product of MOMENTIVE, weight average molecular weight: 3,000, viscosity: 450 mm$^2$/s) represented by formula (C-5), PDM-0421 (product of Gelest Inc., weight average molecular weight: 6,200, viscosity: 100 mm$^2$/s) represented by formula (C-6), and PDM-0821 (product of Gelest Inc., weight average molecular weight: 8,600, viscosity: 125 mm$^2$/s) represented by formula (C-7).

[F16]

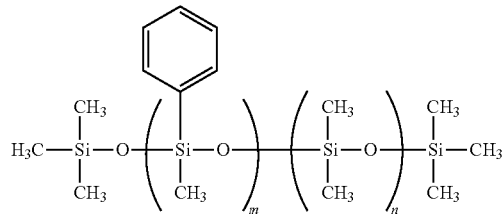

(C-1)

(Each of m and n represents the number of repeating units.)

[F17]

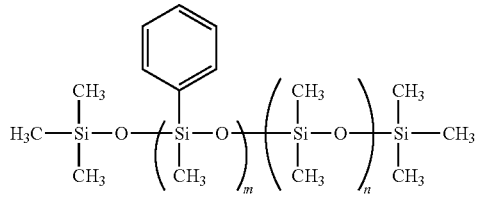

(C-2)

(Each of m and n represents the number of repeating units.)

[F18]

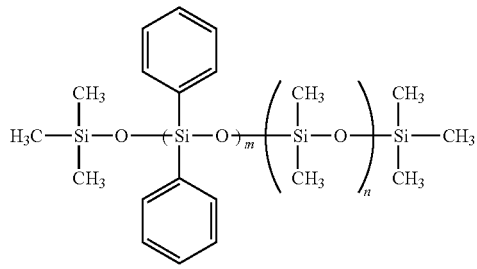

(C-3)

(Each of m and n represents the number of repeating units.)

[F19]

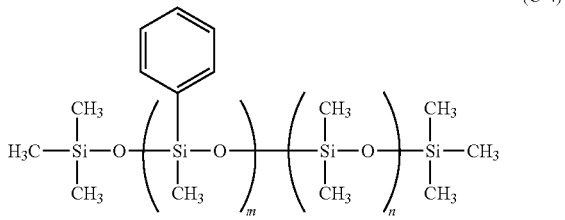

(C-4)

(Each of m and n represents the number of repeating units.)

[F20]

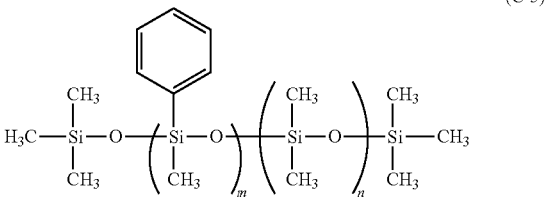

(C-5)

(Each of m and n represents the number of repeating units.)

[F21]

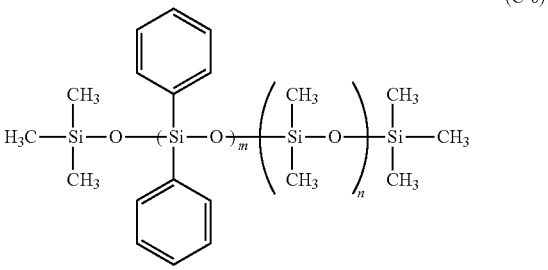

(C-6)

(Each of m and n represents the number of repeating units.)

[F22]

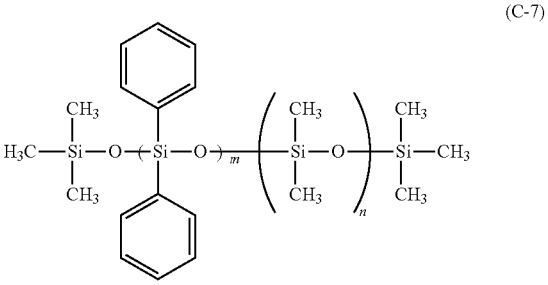

(C-7)

(Each of m and n represents the number of repeating units.)

The adhesive composition of the present invention for use in debonding with light irradiation contains the components (A) and (B) at any compositional ratio. In consideration of the balance between bonding performance and debonding performance, the compositional ratio (mass %) of component (A) to component (B) is preferably 99.995:0.005 to 30:70, more preferably 99.9:0.1 to 75:25.

For the purpose of adjusting the viscosity or for other reasons, the adhesive composition for use in debonding with light irradiation may contain a solvent. Specific examples of the solvent include, but are not limited to, an aliphatic hydrocarbon, an aromatic hydrocarbon, and a ketone.

More specific examples of the solvent include, but are not limited to, hexane, heptane, octane, nonane, decane, undecane, dodecane, isododecane, menthane, limonene, toluene, xylene, mesitylene, cumene, MIBK (methyl isobutyl ketone), butyl acetate, diisobutyl ketone, 2-octanone, 2-nonanone, and 5-nonanone. These solvents may be used singly or in combination of two or more species.

In the case where the adhesive composition of the present invention for use in debonding with light irradiation contains a solvent, the solvent content is appropriately adjusted in consideration of a target viscosity of the adhesive, the application method to be employed, the thickness of the formed thin film, etc. The solvent content of the entire composition is about 10 to about 90 mass %.

The adhesive composition of the present invention for use in debonding with light irradiation may further contain, in addition to the aforementioned components, silica particles for the purpose of, for example, improving peelability.

As used herein, the term "silica particles" refers to particles of silicon dioxide having a mean particle size on the order of nanometers (typically 500 nm or less, preferably 100 nm or less). The particle size is measured through the BET method on the basis of a nitrogen adsorption isotherm.

The adhesive composition of the present invention for use in debonding with light irradiation containing silica particles can be produced by use of silicone powder having a specific mean particle size or a silica sol containing silica having a specific mean particle size.

Specific examples of the silicone powder include, but are not limited to, Silicone Powder KMP Series KMP-600, KMP-601, KMP-602, and KMP-605, and X-52-7030 (products of Shin-Etsu Chemical Co., Ltd.).

Specific examples of the colloidal silica (silica sol) include, but are not limited to, MA-ST-S (silica sol dispersed in methanol), MT-ST (silica sol dispersed in methanol), MA-ST-UP (silica sol dispersed in methanol), trade name MA-ST-M (silica sol dispersed in methanol), MA-ST-L (silica sol dispersed in methanol), IPA-ST-S (silica sol dispersed in isopropanol), IPA-ST (silica sol dispersed in isopropanol), IPA-ST-UP (silica sol dispersed in isopropanol), IPA-ST-L (silica sol dispersed in isopropanol), IPA-ST-ZL (silica sol dispersed in isopropanol), NPC-ST-30 (silica sol dispersed in n-propylcellosolve), PGM-ST (silica sol dispersed in 1-methoxy-2-propanol), DMAC-ST (silica sol dispersed in dimethylacetamide), XBA-ST (silica sol dispersed in xylene-n-butanol solvent mixture), trade name EAC-ST (silica sol dispersed in ethyl acetate), PMA-ST (silica sol dispersed in propylene glycol monomethyl ether acetate), MEK-ST (silica sol dispersed in methyl ethyl ketone), MEK-ST-UP (silica sol dispersed in methyl ethyl ketone), MEK-ST-L (silica sol dispersed in methyl ethyl ketone), and MIBK-ST (silica sol dispersed in methyl isobutyl ketone) (products of Nissan Chemical Corporation).

The adhesive composition of the present invention for use in debonding with light irradiation can be effectively produced by use of a silica sol containing, as a dispersion medium, an organic solvent contained in the target final composition. It is noted that the sol concentration or the amount of the sol used must be determined so as to achieve a desired amount of silica particles contained in the eventually produced composition. The solvent of the silica sol can be replaced with a desired solvent via solvent displacement through a customary method.

When the adhesive composition of the present invention for use in debonding with light irradiation contains silica particles, the amount of the silica particles is generally 50 mass % or less relative to the adhesive component (S) from the viewpoint of preventing inhibition of curing of the composition.

The adhesive composition of the present invention for use in debonding with light irradiation generally has a viscosity (25° C.) of 1,000 to 20,000 mPa·s, preferably 1,000 to 5,000 mPa·s. The viscosity of the adhesive composition of the present invention for use in debonding with light irradiation may be controlled by modifying the type and formulation of the organic solvent used, the film-forming component concentration, etc., in consideration of various factors such as the coating method employed and the target film thickness.

The adhesive composition of the present invention for use in debonding with light irradiation may be produced by mixing film-forming components with solvent. However, in the case where no solvent is used, the adhesive composition of the present invention for use in debonding with light irradiation may be produced by mixing film-forming components.

No particular limitation is imposed on the sequential order of mixing, so long as the adhesive composition of the present invention for use in debonding with light irradiation can be easily produced at high reproducibility. One possible example of the production method includes dissolving all film-forming components in a solvent. Another possible example of the production method includes dissolving a part of film-forming components in a solvent, dissolving the other film-forming components in another solvent, and mixing the thus-obtained two solutions. In this case, if required, a part of the solvent or a film-forming component having high dissolvability may be added in a final stage. So long as the relevant components are not decomposed or denatured in preparation of the composition, the mixture may be appropriately heated.

In the present invention, in order to remove foreign substances present in the adhesive composition for use in debonding with light irradiation, the composition may be filtered through a sub-micrometer filter or the like in the course of production of the composition or after mixing all the components.

As mentioned above, the laminate of the present invention includes a first substrate formed of a semiconductor-forming substrate, a second substrate which is formed of a support substrate and which allows passage of laser light, and an adhesive layer which is a cured film formed by use of the aforementioned adhesive composition for use in debonding with light irradiation. Thus, no particular limitation is imposed on the laminate production method, so long as the adhesive layer is formed of a cured film is produced by use of the aforementioned adhesive composition for use in debonding with light irradiation. From the viewpoint of attaining the effects of the present invention at high reproducibility or for other reasons, the laser transmittance of the adhesive layer is preferably 99% or lower, more preferably 90% or lower, still more preferably 85% or lower, yet more preferably 80% or lower, and the lower limit of the transmittance is 0% (i.e., complete laser absorption). However, no particular limitation is imposed on the transmittance, so long as the adhesive layer can absorb laser light at a dose required for debonding.

In one preferred mode of the present invention, the laminate production method of the present invention includes a first step of applying the adhesive composition for use in debonding with light irradiation onto a surface of the first substrate or the second substrate, to thereby form an adhesive coating layer; and a second step of bonding the first substrate to the second substrate by the mediation of the adhesive coating layer; applying a load to the first substrate and the second substrate in a thickness direction, to thereby closely bind the first substrate, the adhesive coating layer, and the second substrate, while at least one of a heat treatment and a reduced pressure treatment is performed; and then performing a post-heat treatment. Through the post-heat treatment in the second step, the adhesive coating layer is suitably cured in a final stage, to thereby provide an adhesive layer.

In one embodiment, the first substrate is a wafer, and the second substrate is a support. The adhesive composition for use in debonding with light irradiation may be applied to either of the first or second substrate, or both of the first and second substrates. Among two substrates, the first substrate is preferred.

No particular limitation is imposed on the wafer, and an example of the wafer is a silicon wafer or a glass wafer having a diameter of about 300 mm and a thickness of about 770 μm.

No particular limitation is imposed on the support (carrier), so long as the support allows passage of laser light. The transmittance of the support is generally 80% or higher, preferably 90% or higher. Examples of the support include, but are not limited to, is a silicon wafer having a diameter of about 300 mm and a thickness of about 700 μm.

As used herein, the term "laser light" is laser light employed in the below-mentioned debonding (peeling) step. The wavelength of the laser light is generally 190 nm to 600 nm. From the viewpoints of suitably performing debonding at high reproducibility and the like, the wavelength is preferably 250 nm or longer, more preferably 300 nm or longer, and preferably 580 nm or shorter, more preferably 560 nm or shorter. Laser light having a wavelength of, for example, 308 nm, 355 nm, or 532 nm can suitably debond the laminate of the present invention.

The thickness of the adhesive coating layer is generally 5 to 500 μm. However, the thickness is preferably 10 μm or greater, more preferably 20 μm or greater, still more preferably 30 μm or greater, from the viewpoint of maintaining the film strength, and it is preferably 200 μm or less, more preferably 150 μm or less, still more preferably 120 μm or less, yet more preferably 70 μm or less, from the viewpoint of avoiding variation in uniformity of the film thickness.

No particular limitation is imposed on the application method, and spin coating is generally employed. In an alternative method, a coating film is formed through spin coating or a similar technique, and the sheet-form coating film is attached. The concepts of the application method and the coating film of the invention also encompasses the alternative method and coating film.

The temperature of heating the coated adhesive composition for use in debonding with light irradiation cannot definitely be determined, since the temperature varies depending on the thickness, etc. of the adhesive layer. However, the heating temperature is generally 80° C. or higher, preferably 150° C. or lower, from the viewpoint of prevention of excessive curing. The time of heating is generally 30 seconds or longer, preferably 1 minute or longer, for securing temporary bonding performance. Also, the heating time is generally 5 minutes or shorter, preferably 2 minutes or shorter, from the viewpoint of suppressing deterioration of the adhesive layer and other members. Notably, heating may be performed by means of a hot plate, an oven, or the like.

In the reduced pressure treatment, the two substrates and the adhesive coating layer disposed therebetween are placed in an atmosphere at 10 Pa to 10,000 Pa. The time of the reduced pressure treatment is generally 1 to 30 minutes.

In one preferred embodiment of the present invention, the two substrates and the adhesive coating layer disposed therebetween are bonded together preferably through a heat treatment, more preferably through a heating treatment in combination with a reduced pressure treatment.

No particular limitation is imposed on the load which is applied to the first substrate and the second substrate in a thickness direction, so long as the first substrate, the second substrate, and the layer therebetween are not damaged, and these elements are closely adhered. The load is generally 10 to 1,000 N.

The temperature of post-heating is preferably 120° C. or higher from the viewpoint of attaining sufficient curing rate, and preferably 260° C. or lower from the viewpoint of preventing deterioration of the substrates and the adhesives. The heating time is generally 1 minute or longer from the viewpoint of achieving suitable joining of a wafer through curing, preferably 5 minutes or longer from the viewpoint of, for example, stability in physical properties of the adhesives. Also, the heating time is generally 180 minutes or shorter, preferably 120 minutes or shorter, from the viewpoint of avoiding, for example, an adverse effect on the adhesive layers due to excessive heating. Heating may be performed by means of a hot plate, an oven, or the like. Notably, a purpose of performing post-heating is to, for example, more suitably cure the adhesive component (S) containing the component (A) which is cured through hydrosilylation.

In the debonding method of the present invention, the laminate of the present invention is irradiated with laser light from the second substrate side, to thereby remove the second substrate. In the laminate of the present invention, the first substrate is temporarily bonded, in a suitably peelable manner, to the second substrate which allows passage of laser light by the mediation of the adhesive layer which absorbs laser light. Thus, when the adhesive layer receives the laser light irradiation from the second substrate side, the adhesive layer absorbs the laser light, to thereby cause decomposition of the surface of the layer. In this case, a gas is generated between the adhesive layer and the second substrate in such a volume that the substrate is not damaged by the gas. As a result, the bonding strength decreases, and the second substrate can be easily separated from the first substrate and the adhesive layer at the interface between the second substrate and the adhesive layer. Generally, the debonding operation is carried out after completion of production of the laminate of the present invention and a specific processing and the like.

As used herein, the term "processing" refers to, for example, a processing of a surface opposite the circuit-furnished surface of a wafer; e.g., a thinning of a wafer by polishing the backside thereof. Thereafter, through silicon vias (TSVs) and the like are formed, and the thinned wafer is removed from the support. A plurality of such wafers are stacked to form a wafer laminate, to thereby complete 3-dimensional mounting. Before or after the above process, a backside electrode and the like are formed on the wafer. When thinning of a wafer and the TSV process are performed, a thermal load of 250 to 350° C. is applied to the laminate bonded to the support. The laminate of the present invention including the adhesive layer has heat resistance to the load.

The processing is not limited to the aforementioned process and includes, for example, a semiconductor part mounting process in the case where a wafer is temporarily bonded to a support for supporting a substrate on which semiconductor parts are to be mounted.

In one specific embodiment, when the backside surface (a surface opposite the circuit-furnished surface) of a wafer having a diameter of about 300 mm and a thickness of about 770 µm is polished, the thickness of the wafer can be reduced to about 80 µm to about 4 µm.

Notably, the entire area of the adhesive layer is not necessarily irradiated with laser light. Even when the adhesive layer has both a laser light-irradiated area and a laser light-non-irradiated area, it is sufficient that the bonding strength of the entire adhesive layer is satisfactorily reduced. Under such conditions, the second substrate can be easily separated, through application of small external force (e.g., pulling), from the laminate at the interface between the adhesive layer and the second substrate. The ratio of the laser light-irradiated area to the laser light-non-irradiated area and the locational distribution of the two areas vary depending on the type and composition of the adhesive used, the thickness of the adhesive layer, the intensity of irradiation laser light, and other factors. However, those skilled in the art can set appropriate conditions, without carrying out excessive tests. For example, a laser light-non-irradiated area may be provided adjacent to a laser light-irradiated area with the same width as that of the laser light.

Thus, even when only a part of the adhesive layer is irradiated with laser light, the second substrate can be separated. As a result, the time for applying laser light to one laminate can be shortened, whereby the total time for debonding can be shortened.

EXAMPLES (1) Agitator: planetary centrifugal mixer ARE-500 (product of Thinky Corporation)
(2) Viscometer: rotary viscometer TVE-22H (product of Toki Sangyo Co., Ltd)
(3) Ultrasonic apparatus: ASU CLEANER (ASU-6, product of AS ONE CORPORATION)
(4) Measurement of transmittance: ultraviolet and visible spectrophotometer UV2550 (product of Shimadzu Corporation).
(5) Vacuum bonding apparatus: manual bonder (product of Suess Microtec SE)
(6) 308 nm Laser irradiation apparatus: 308 nm laser irradiation apparatus (product of Suess Microtec SE)
(7) 355 nm Laser irradiation apparatus: LT-2137 (product of Lotus-TII)
(8) 532 nm Laser irradiation apparatus: LT-2137 (product of Lotus-TII)
(9) Infrared radiation thermometer: infrared radiation thermometer 835-H1 (product of Testo)

[1] Preparation of Composition

Preparation Example 1

An MQ resin containing polysiloxane and vinyl groups (product of WACKER Chemie AG) (80 g) serving as polyorganosiloxane (a1), linear-chain polydimethylsiloxane containing SiH groups (viscosity: 100 mPa·s) (product of WACKER Chemie AG) (2.52 g) serving as polyorganosiloxane (a2), linear-chain polydimethylsiloxane containing SiH groups (viscosity: 70 mPa·s) (product of WACKER Chemie AG) (5.89 g) serving as polyorganosiloxane (a2), and 1-ethynyl-1-cyclohexanol (product of WACKER Chemie AG) (0.22 g) serving as a polymerization inhibitor (A3) were added to a 600-mL container dedicated for an agitator, and the mixture was agitated by means of the agitator for 5 minutes.

To the resultant mixture was added a portion (3.96 g) of a mixture prepared by agitating a platinum catalyst (product of WACKER Chemie AG) (0.147 g) serving as a platinum group metal catalyst (A2) and linear-chain polydimethylsiloxane containing vinyl groups (viscosity: 1,000 mPa·s) (product of WACKER Chemie AG) (5.81 g) serving as polyorganosiloxane (a1) by means of an agitator for 5 minutes. Subsequently, the resultant mixture was agitated by means of the agitator for 5 minutes.

Finally, the resultant mixture was filtered through a nylon filter (300 mesh), to thereby prepare a precursor composition (P).

Example 1-1

The precursor composition (P) (19.7 g), 1,1-diphenyl-2-propyn-1-ol (product of Tokyo Chemical Industry Co., Ltd.) (0.04 g) serving as a polymerization inhibitor (A3), and polyorganosiloxane (viscosity: 1,000,000 mm$^2$/s) (trade name: AK1000000, product of WACKER Chemie AG) (8.54 g) serving as a component (B) containing polydimethylsiloxane were added to a 200-mL container dedicated for an agitator, and the mixture was agitated by means of the agitator for 5 minutes.

To the resultant mixture was added a mixture prepared by addition of thioindigo (product of Tokyo Chemical Industry Co., Ltd.) (0.40 g) serving as a light-absorbing organic compound (X), silica particles X-52-854 (product of Shin-Etsu Chemical Co., Ltd.) (4.92 g), and mesitylene (product of Tokyo Chemical Industry Co., Ltd.) (11.82 g) to a 50-mL screw vial, and subsequent ultrasonic treatment by means of an ultrasonic apparatus for 5 minutes. The resultant mixture was agitated by means of an agitator for 5 minutes.

Finally, the mixture was filtered through a PTFE filter (5.0 µm), to thereby yield a composition for use in debonding with light irradiation.

Example 1-2

The precursor composition (P) (19.7 g), 1,1-diphenyl-2-propyn-1-ol (product of Tokyo Chemical Industry Co., Ltd.) (0.04 g) serving as a polymerization inhibitor (A3), and polyorganosiloxane (viscosity: 1,000,000 mm$^2$/s) (trade name: AK1000000, product of WACKER Chemie AG) (8.54 g) serving as a component (B) containing polydimethylsiloxane were added to a 200-mL container dedicated for an agitator, and the mixture was agitated by means of the agitator for 5 minutes.

To the resultant mixture was added a mixture prepared by addition of Oralith Brilliant Pink R (product of Tokyo Chemical Industry Co., Ltd.) (0.40 g) serving as a light-absorbing organic compound (X), silica particles X-52-854 (product of Shin-Etsu Chemical Co., Ltd.) (4.92 g), and mesitylene (product of Tokyo Chemical Industry Co., Ltd.) (11.82 g) to a 50-mL screw vial, and subsequent ultrasonic treatment by means of an ultrasonic apparatus for 5 minutes. The resultant mixture was agitated by an agitator for 5 minutes.

Finally, the mixture was filtered through a PTFE filter (5.0 µm), to thereby yield a composition for use in debonding with light irradiation.

Example 1-3

The precursor composition (P) (19.7 g), 1,1-diphenyl-2-propyn-1-ol (product of Tokyo Chemical Industry Co., Ltd.) (0.04 g) serving as a polymerization inhibitor (A3), and polyorganosiloxane (viscosity: 1,000,000 mm$^2$/s) (trade name: AK1000000, product of WACKER Chemie AG) (8.54 g) serving as a component (B) containing polydimethylsiloxane were added to a 200-mL container dedicated for an agitator, and the mixture was agitated by means of the agitator for 5 minutes.

To the resultant mixture was added a mixture prepared by addition of thioindigo (product of Tokyo Chemical Industry Co., Ltd.) (0.40 g) serving as a light-absorbing organic compound (X) and mesitylene (product of Tokyo Chemical Industry Co., Ltd.) (11.82 g) to a 50-mL screw vial, and subsequent ultrasonic treatment by means of an ultrasonic apparatus for 5 minutes. The resultant mixture was agitated by an agitator for 5 minutes.

Finally, the mixture was filtered through a PTFE filter (5.0 µm), to thereby yield a composition for use in debonding with light irradiation.

Comparative Example 1-1

The precursor composition (P) (19.7 g), 1,1-diphenyl-2-propyn-1-ol (product of Tokyo Chemical Industry Co., Ltd.) (0.04 g) serving as a polymerization inhibitor (A3), and polyorganosiloxane (viscosity: 1,000,000 mm$^2$/s) (trade name: AK1000000, product of WACKER Chemie AG) (8.54 g) serving as a component (B) containing polydimethylsiloxane were added to a 200-mL container dedicated for an agitator, and the mixture was agitated by means of the agitator for 5 minutes.

To the resultant mixture was added a mixture prepared by addition of silica particles X-52-854 (product of Shin-Etsu Chemical Co., Ltd.) (4.92 g) and mesitylene (product of Tokyo Chemical Industry Co., Ltd.) (11.82 g) to a 50-mL screw vial, and subsequent ultrasonic treatment by means of an ultrasonic apparatus for 5 minutes. The resultant mixture was agitated by an agitator for 5 minutes.

Finally, the mixture was filtered through a PTFE filter (5.0 µm), to thereby yield a composition.

Comparative Example 1-2

The preparation of a composition was tried in the same manner as employed in Example 1-1, except that thioindigo was replaced with New Coccine represented by formula (C1), which is a low-molecular-weight compound known to have light absorbability. However, precipitates were observed in the resultant composition; i.e., a composition homogeneous enough to enable formation of a thin film failed to be prepared. In this case, the composition was not filtered, since it was obvious that poor filtration would occur.

[F23]

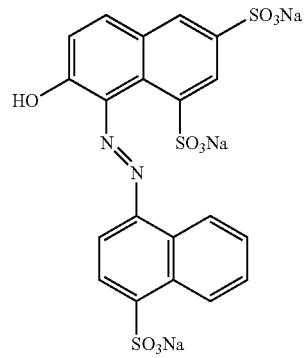

(C-1)

Referential Example 1-1

The precursor composition (P) (19.7 g), 1,1-diphenyl-2-propyn-1-ol (product of Tokyo Chemical Industry Co., Ltd.) (0.04 g) serving as a polymerization inhibitor (A3), and polyorganosiloxane (viscosity: 1,000,000 mm$^2$/s) (trade name: AK1000000, product of WACKER Chemie AG) (8.54 g) serving as a component (B) containing polydimethylsiloxane were added to a 200-mL container dedicated for an agitator, and the mixture was agitated by means of the agitator for 5 minutes. Finally, the resultant mixture was filtered through a PTFE filter (5.0 µm), to thereby yield a composition.

[2] Formation of Thin Film and Measurement of Transmittance

Example 2-1

The composition prepared in Example 1-1 was applied onto a quartz substrate by means of a spin coater and heated with a hot plate at 120° C. for 1.5 minutes and then at 200° C. for 10 minutes, to thereby form a thin film having a thickness of 30 µm.

Examples 2-2 and 2-3, Comparative Example 2-1, and Referential Example 2-1

A thin film was formed in the same manner as employed in Example 2-1, except that the composition prepared in Example 1-1 was replaced with each of the compositions prepared in Examples 1-2 and 1-3, Comparative Example 1-1, and Referential Example 1-1.

The light transmittances (at 308 nm and 532 nm) of the resultant thin film were measured for determining whether or not the thin film was usable as a layer for debonding with laser light. The results are shown in Table 1.

As compared with the thin film formed in Referential Example 2-1, the thin film formed in each of Examples 2-1 to 2-3 exhibited low laser light transmittance at 308 nm and 532 nm by virtue of thioindigo contained in the thin film. The results suggested that the thin film of each of the Examples can be used in debonding with laser light irradiation.

The thin film formed in Comparative Example 2-1 also exhibited low transmittance despite the absence of thioindigo in the thin film. This phenomenon is attributed to light scattering caused by silica particles contained in the thin film.

TABLE 1

|  | Transmittance (%) | |
| --- | --- | --- |
|  | @308 nm | @532 nm |
| Example 2-1 | 9.2 | 15.4 |
| Example 2-2 | 60.6 | 60.3 |
| Example 2-3 | 17.9 | 27.6 |
| Comparative Example 2-1 | 12.5 | 30.3 |
| Referential Example 2-1 | 100 | 100 |

[3] Determination of Optimal Irradiation Dose of Laser Light (308 nm) for Debonding and Detection of Heat Generation During Irradiation Example 3-1

The composition prepared in Example 1-1 was applied, by means of a spin coater, to a 100-mm silicon wafer (thickness: 500 µm) serving as a device-side wafer and heated on a hot plate at 120° C. for 1.5 minutes, to thereby form a thin film. A 100-mm glass wafer (EAGLE-XG, product of Corning Inc., thickness: 500 µm) serving as a carrier-side wafer (support) was bonded to the silicon wafer so as to sandwich the above-formed thin film between these wafers in a vacuum bonding apparatus. The resultant product was placed on a hot plate so that the device-side wafer was located downward, and heated at 200° C. for 10 minutes, to thereby cure the above-formed thin film and to produce a laminate. Bonding was performed at 25° C., and a reduced pressure of 1,000 Pa with a load of 30 N.

Example 3-2

A laminate was produced in the same manner as employed in Example 3-1, except that the composition prepared in Example 1-1 was replaced with the composition prepared in Example 1-2.

Each of the resultant laminates was irradiated with laser light (wavelength: 308 nm) from the glass wafer side by means of a laser irradiation apparatus. In this case, the output was varied, and the minimum irradiation dose required for occurrence of debonding was determined within an output range of 100 to 500 mJ/cm$^2$.

As a result, debonding was confirmed at 300 mJ/cm$^2$ in each laminate. This value was defined as an optimal irradiation dose, and a debonding test was performed by use of laser light having a wavelength of 308 nm.

The temperature of each laminate was measured by means of an infrared radiation thermometer before and after laser light irradiation for determining whether or not heat generation occurred during laser light irradiation.

The temperature of each laminate was found to be about 24° C. before laser light irradiation and about 21° C. after laser light irradiation. Thus, it was determined that substantially no heat generation occurred in the film through laser light irradiation.

[4] Detection of Debonding Property by Laser Light (Wavelength: 308 nm) (Confirmation of Debonding by the Entire Surface Irradiation)

Examples 4-1 and 4-2

Each of laminates produced in the same manner as employed in Examples 3-1 and 3-2 was irradiated with laser light (wavelength: 308 nm) from the glass wafer side by means of a laser irradiation apparatus so that irradiation was performed over the entire surface of the wafer, to thereby determine whether or not the glass wafer was removed. In this case, laser irradiation was performed so as to prevent overlapping in front-back and left-right directions. The laser output was adjusted to 300 mJ/cm$^2$ in each of the Examples.

The glass wafer (on the carrier side) was found to be readily removed manually under application of substantially no force in each of the laminates of Examples 4-1 and 4-2.

[5] Determination of Optimal Irradiation Dose of Laser Light (532 nm) for Debonding and Detection of Heat Generation During Irradiation Examples 5-1 and 5-2

Laminates of Examples 5-1 and 5-2 were produced in the same manner as employed in Examples 3-1 and 3-2, respectively.

Example 5-3

A laminate was produced in the same manner as employed in Example 5-1, except that the composition prepared in Example 1-1 was replaced with the composition prepared in Example 1-3.

Comparative Example 5-1

A laminate was produced in the same manner as employed in Example 5-1, except that the composition prepared in Example 1-1 was replaced with the composition prepared in Comparative Example 1-1.

Each of the resultant laminates was irradiated with laser light (wavelength: 532 nm) from the glass wafer side by means of a laser irradiation apparatus. In this case, the output was varied, and the minimum irradiation dose required for occurrence of debonding was determined within an output range of 20 to 160 mJ/cm$^2$.

As a result, debonding was confirmed at 300 mJ/cm$^2$ in the laminate of Example 5-1, at 400 mJ/cm$^2$ in the laminate of Example 5-2, and 500 mJ/cm$^2$ in the laminate of Example 5-3. In contrast, no debonding was confirmed in the laminate of Comparative Example 5-1. Each of the values determined in the laminates of the Examples was defined as an optimal irradiation dose, and a debonding test was performed by use of laser light having a wavelength of 532 nm.

The temperature of each of the laminates of Examples 5-1 and 5-2 was measured by means of an infrared radiation thermometer before and after laser light irradiation for determining whether or not heat generation occurred during laser light irradiation.

The temperature of each laminate was found to be about 21° C. before laser light irradiation and about 25° C. after laser light irradiation. Thus, it was determined that substantially no heat generation occurred in the film through laser light irradiation.

[6] Detection of Debonding Property by Laser Light (Wavelength: 532 nm) (Confirmation of Debonding by the Entire Surface Irradiation)

Examples 6-1 and 6-2

Each of laminates produced in the same manner as employed in Examples 5-1 and 5-2 was irradiated with laser light (wavelength: 532 nm) from the glass wafer side by means of a laser irradiation apparatus so that irradiation was performed over the entire surface of the wafer, to thereby determine whether or not the glass wafer was removed. In this case, laser irradiation was performed so as to prevent overlapping in front-back and left-right directions. The laser output was adjusted to 300 J/cm² in Example 6-1 and 400 J/cm² in Example 6-2.

The glass wafer (on the carrier side) was found to be readily removed manually under application of substantially no force in each laminate.

[7] Determination of Optimal Irradiation Dose of Laser Light (355 nm) for Debonding and Detection of Heat Generation During Irradiation Examples 7-1 and 7-2

Laminates of Examples 7-1 and 7-2 were produced in the same manner as employed in Examples 3-1 and 3-2, respectively.

Comparative Example 7-1

A laminate was produced in the same manner as employed in Example 7-1, except that the composition prepared in Example 1-1 was replaced with the composition prepared in Comparative Example 1-1.

Each of the resultant laminates was irradiated with laser light (wavelength: 355 nm) from the glass wafer side by means of a laser irradiation apparatus. In this case, the output was varied, and the minimum irradiation dose required for occurrence of debonding was determined within an output range of 20 to 80 mJ/cm².

As a result, debonding was confirmed at 160 mJ/cm² in each of the laminates of Examples 7-1 and 7-2, but no debonding was confirmed in the laminate of Comparative Example 7-1. Each of the values determined in the laminates of the Examples was defined as an optimal irradiation dose, and a debonding test was performed by use of laser light having a wavelength of 355 nm.

The temperature of each of the laminates of Examples 7-1 and 7-2 was measured by means of an infrared radiation thermometer before and after laser light irradiation for determining whether or not heat generation occurred during laser light irradiation.

The temperature of each laminate was found to be about 22° C. before laser light irradiation and about 23° C. after laser light irradiation. Thus, it was determined that substantially no heat generation occurred in the film through laser light irradiation.

[8] Detection of Debonding Property by Laser Light (Wavelength: 355 nm) (Confirmation of Debonding by the Entire Surface Irradiation)

Examples 8-1 and 8-2

Each of laminates produced in the same manner as employed in Examples 7-1 and 7-2 was irradiated with laser light (wavelength: 355 nm) from the glass wafer side by means of a laser irradiation apparatus so that irradiation was performed over the entire surface of the wafer, to thereby determine whether or not the glass wafer was removed. In this case, laser irradiation was performed so as to prevent overlapping in front-back and left-right directions. The laser output was adjusted to 160 mJ/cm² in Examples 8-1 and 8-2.

The glass wafer (on the carrier side) was found to be readily removed manually under application of substantially no force in each laminate.

The invention claimed is:

1. An adhesive composition for use in debonding with light irradiation, which composition can achieve debonding through irradiation with light, wherein:

the adhesive composition comprises:

an adhesive component (S) that is curable through hydrosilyation, and a light-absorbing organic compound (X); and the light-absorbing organic compound (X) contains, in the molecule thereof, one or more aromatic rings, one or more rings each containing a heteroatom forming the ring, and one or more groups selected from among a carbonyl group and a thiocarbonyl group, wherein the carbon atoms of the carbonyl or thiocarbonyl group constitute the ring that contains the hetereatom in the ring.

2. The adhesive composition for use in debonding with light irradiation according to claim 1, wherein the light-absorbing organic compound (X) contains, in the molecule thereof, two or more aromatic rings, two or more rings each containing a heteroatom forming the ring, and two or more carbonyl or thiocarbonyl groups.

3. The adhesive composition for use in debonding with light irradiation according to claim 2 wherein the aromatic rings are condensed with the rings each containing a heteroatom forming the ring.

4. The adhesive composition for use in debonding with light irradiation according to claim 1, wherein the light-absorbing organic compound (X) is represented by the following formula (T1-1) or (T2-1):

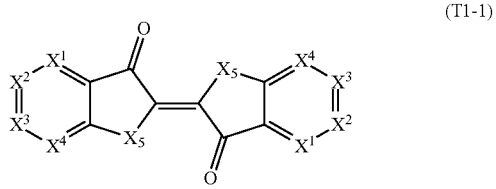

(T1-1)

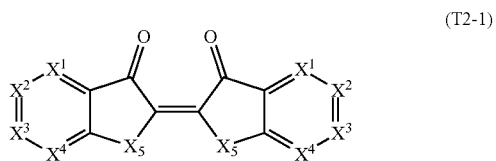

(T2-1)

wherein each of $X^1$ to $X^4$ represents a carbon atom forming an aromatic ring, and is bonded to the adjacent carbon atoms forming the aromatic ring and to a hydrogen atom, a halogen atom, or a monovalent organic group; and $X^5$ each represents a heteroatom.

5. The adhesive composition for use in debonding with light irradiation according to claim 1, wherein the light-absorbing organic compound (X) is a thioindigo derivative or an isothioindigo derivative.

6. The adhesive composition for use in debonding with light irradiation according to claim 5, wherein the thioindigo derivative or the isothioindigo derivative is represented by the following formula (T1-2) or (T2-2):

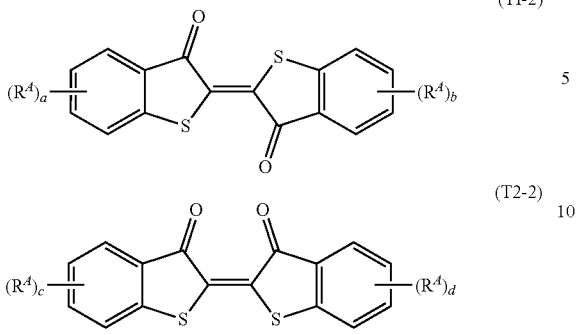

wherein $R^A$ is a substituent atom or group of a benzene ring, and represents a halogen atom, an alkyl group, an alkenyl group, an alkynyl group, or an aryl group; and each of a to d represents an integer of 0 to 4.

7. The adhesive composition for use in debonding with light irradiation according to claim 6, wherein the thioindigo derivative or the isothioindigo derivative is represented by the following formula (T1-3) or (T2-3):

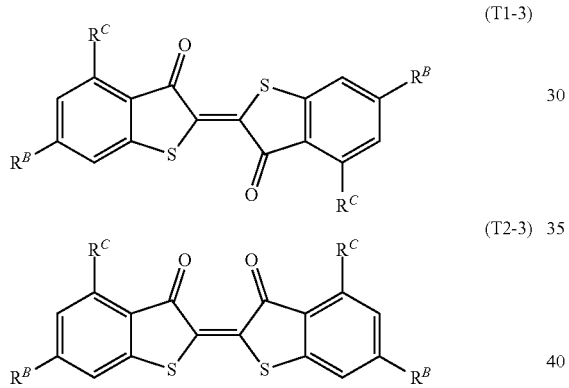

wherein each of $R^B$ and $R^C$ represents a hydrogen atom, a halogen atom, or an alkyl group.

8. The adhesive composition for use in debonding with light irradiation according to claim 1, wherein the adhesive composition further comprises a component (B) containing at least one component selected from the group consisting of a component containing an epoxy-modified polyorganosiloxane, a component containing a methyl-group-containing polyorganosiloxane, and a component containing a phenyl-group-containing polyorganosiloxane.

9. The adhesive composition for use in debonding with light irradiation according to claim 1, wherein the component (S) which is cured through hydrosilylation comprises a polysiloxane (A1) having one or more units selected from the group consisting of a siloxane unit represented by $SiO_2$ (unit Q), a siloxane unit represented by $R^1R^2R^3SiO_{1/2}$ (unit M), a siloxane unit represented by $R^4R^5SiO_{2/2}$ (unit D), and a siloxane unit represented by $R^6SiO_{3/2}$ (unit T), wherein each of $R^1$ to $R^6$ is a group or an atom bonded to a silicon atom and represents an alkyl group, an alkenyl group, or a hydrogen atom, and a platinum group metal catalyst (A2); and
the polysiloxane (A1) comprises:
a polyorganosiloxane (a1) having one or more units selected from the group consisting of a siloxane unit represented by $SiO_2$ (unit Q'), a siloxane unit represented by $R^{1'}R^{2'}R^{3'}SiO_{1/2}$ (unit M'), a siloxane unit represented by $R^{4'}R^{5'}SiO_{2/2}$ (unit D'), and a siloxane unit represented by $R^{6'}SiO_{3/2}$ (unit T'), and at least one unit selected from the group consisting of unit M', unit D', and unit T', wherein each of $R^{1'}$ to $R^{6'}$ is a group bonded to a silicon atom and represents an alkyl group or an alkenyl group, and at least one of $R^{1'}$ to $R^{6'}$ is an alkenyl group, and
a polyorganosiloxane (a2) having one or more units selected from the group consisting of a siloxane unit represented by $SiO_2$ (unit Q''), a siloxane unit represented by $R^{1''}R^{2''}R^{3''}SiO_{1/2}$ (unit M''), a siloxane unit represented by $R^{4''}R^{5''}SiO_{2/2}$ (unit D''), and a siloxane unit represented by $R^{6''}SiO_{3/2}$ (unit T''), and at least one unit selected from the group consisting of unit M'', unit D'', and unit T'', wherein each of $R^{1''}$ to $R^{6''}$ is a group or an atom bonded to a silicon atom and represents an alkyl group or a hydrogen atom, and at least one of $R^{1''}$ to $R^{6''}$ is a hydrogen atom.

10. A laminate comprising a first substrate formed of a semiconductor-forming substrate, a second substrate formed of a support substrate which allows passage of laser light, and an adhesive layer, wherein the adhesive layer is a cured film formed from the adhesive composition for use in debonding with light irradiation as recited in claim 1.

11. A method for producing a laminate, the method comprising:
applying the adhesive composition for use in debonding with light irradiation as recited in claim 1 onto a surface of a first or second substrate, to thereby form an adhesive coating layer; and
adhering the first substrate to the second substrate by the mediation of the adhesive coating layer; applying a load to the first substrate and the second substrate in a thickness direction, to thereby closely bind the first substrate, the adhesive coating layer, and the second substrate, while at least one of a heat treatment and a reduced pressure treatment is performed; and then performing a post-heat treatment.

12. A debonding method comprising irradiating a laminate produced through the method for producing a laminate as recited in claim 11 with laser light from the second substrate side of the laminate, to thereby debond the second substrate.

13. The debonding method according to claim 12, wherein the laser light has a wavelength of 190 nm to 600 nm.

* * * * *